(12) United States Patent
Hung et al.

(10) Patent No.: US 9,935,080 B2
(45) Date of Patent: Apr. 3, 2018

(54) THREE-LAYER PACKAGE-ON-PACKAGE STRUCTURE AND METHOD FORMING SAME

(71) Applicant: Taiwan Semiconductor Manufacturing Company, Ltd., Hsin-Chu (TW)

(72) Inventors: Jui-Pin Hung, Hsin-Chu (TW); Feng-Cheng Hsu, New Taipei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/201,873

(22) Filed: Jul. 5, 2016

(65) Prior Publication Data

US 2017/0317053 A1    Nov. 2, 2017

Related U.S. Application Data

(60) Provisional application No. 62/329,331, filed on Apr. 29, 2016.

(51) Int. Cl.
*H01L 21/00* (2006.01)
*H01L 25/065* (2006.01)
(Continued)

(52) U.S. Cl.
CPC .... *H01L 25/0652* (2013.01); *H01L 21/31053* (2013.01); *H01L 21/56* (2013.01); *H01L 21/76885* (2013.01); *H01L 23/3128* (2013.01); *H01L 23/481* (2013.01); *H01L 24/81* (2013.01); *H01L 24/83* (2013.01); *H01L 24/97* (2013.01); *H01L 25/0657* (2013.01); *H01L 25/50* (2013.01); *H01L 2224/0237* (2013.01); *H01L 2224/02311* (2013.01); *H01L 2224/16227* (2013.01); *H01L 2224/32145* (2013.01); *H01L 2224/48091* (2013.01); *H01L 2224/48106* (2013.01); *H01L 2224/48227* (2013.01);
(Continued)

(58) Field of Classification Search
CPC ...... H01L 25/0652; H01L 24/83; H01L 24/97
See application file for complete search history.

(56) References Cited

U.S. PATENT DOCUMENTS

| 8,361,842 B2 | 1/2013 | Yu et al. |
| 8,680,647 B2 | 3/2014 | Yu et al. |

(Continued)

*Primary Examiner* — Laura Menz
(74) *Attorney, Agent, or Firm* — Slater Matsil, LLP

(57) ABSTRACT

A method includes forming a first plurality of redistribution lines, forming a first metal post over and electrically connected to the first plurality of redistribution lines, and bonding a first device die to the first plurality of redistribution lines. The first metal post and the first device die are encapsulated in a first encapsulating material. The first encapsulating material is then planarized. The method further includes forming a second metal post over and electrically connected to the first metal post, attaching a second device die to the first encapsulating material through an adhesive film, encapsulating the second metal post and the second device die in a second encapsulating material, planarizing the second encapsulating material, and forming a second plurality of redistributions over and electrically coupling to the second metal post and the second device die.

10 Claims, 23 Drawing Sheets

(51) Int. Cl.
*H01L 23/00* (2006.01)
*H01L 21/56* (2006.01)
*H01L 21/768* (2006.01)
*H01L 21/3105* (2006.01)
*H01L 25/00* (2006.01)
*H01L 23/48* (2006.01)
*H01L 23/31* (2006.01)

(52) U.S. Cl.
CPC ......... *H01L 2224/73265* (2013.01); *H01L 2225/0652* (2013.01); *H01L 2225/06506* (2013.01); *H01L 2225/06513* (2013.01); *H01L 2225/06548* (2013.01); *H01L 2225/06572* (2013.01); *H01L 2924/01029* (2013.01); *H01L 2924/1431* (2013.01); *H01L 2924/1432* (2013.01); *H01L 2924/1436* (2013.01); *H01L 2924/1438* (2013.01); *H01L 2924/15311* (2013.01); *H01L 2924/19041* (2013.01); *H01L 2924/19105* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,461,018 B1* | 10/2016 | Tsai | H01L 21/6836 |
| 9,570,322 B2* | 2/2017 | Su | H01L 23/481 |
| 9,728,522 B2* | 8/2017 | Su | H01L 23/481 |
| 9,735,131 B2* | 8/2017 | Su | H01L 25/0657 |
| 2011/0291288 A1 | 12/2011 | Wu et al. | |
| 2012/0161332 A1* | 6/2012 | Chua | H01L 21/486 257/774 |
| 2013/0026468 A1 | 1/2013 | Yoshimuta et al. | |
| 2013/0062760 A1 | 3/2013 | Hung et al. | |
| 2013/0062761 A1* | 3/2013 | Lin | H01L 23/49816 257/738 |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0217610 A1* | 8/2014 | Jeng | H01L 23/3128 257/774 |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0148903 A1* | 5/2016 | Su | H01L 23/481 257/737 |
| 2016/0351472 A1* | 12/2016 | Park | H01L 23/481 |
| 2017/0133351 A1* | 5/2017 | Su | H01L 25/50 |
| 2017/0148768 A1* | 5/2017 | Su | H01L 23/49827 |

* cited by examiner

THREE-LAYER PACKAGE-ON-PACKAGE STRUCTURE AND METHOD FORMING SAME

PRIORITY CLAIM AND CROSS-REFERENCE

This application claims the benefit of the following provisionally filed U.S. Patent Application Ser. No. 62/329,331, filed Apr. 29, 2016, and entitled "Three-Layer Package-on-Package Structure and Method Forming Same;" which application is hereby incorporated herein by reference.

BACKGROUND

The fabrication of modern circuits typically involves several steps. Integrated circuits are first fabricated on a semiconductor wafer, which contains multiple duplicated semiconductor chips, each including integrated circuits. The semiconductor chips are then sawed from the wafer and packaged. The packaging processes have two main purposes: to protect the semiconductor chips and connect interior integrated circuits to exterior pins.

With the increasing demand for more functions, Package-on-Package (PoP) technology, in which two or more packages are bonded in order to expand the integration ability of the packages, was developed. With a high degree of integration, the electrical performance of the resulting PoP package can be improved benefiting from the shortened connecting paths between components. By using the PoP technology, package design becomes more flexible and less complex. Time-to-market is also reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
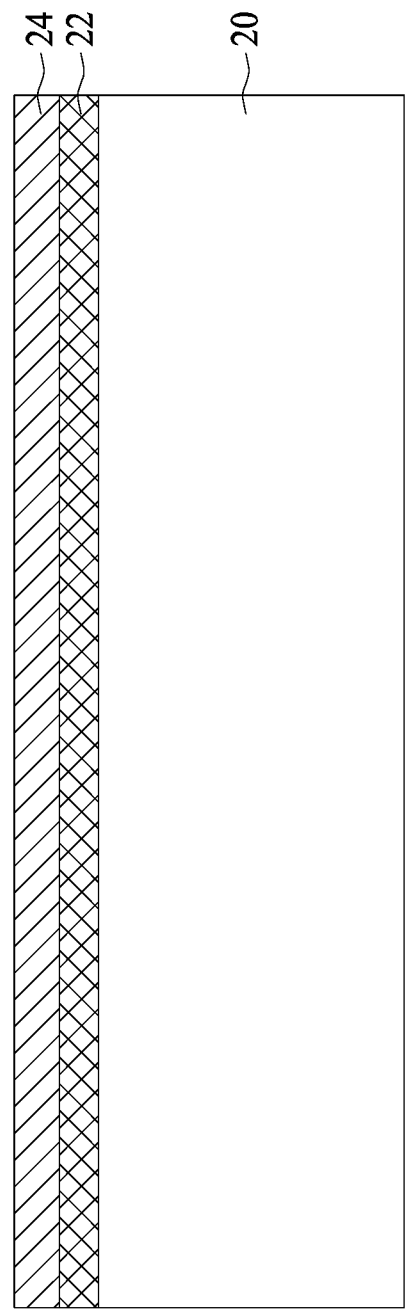
FIGS. 1 through 21 illustrate the cross-sectional views of intermediate stages in the formation of a fan-out Package-on-Package (PoP) structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fan-out Package-on-Package (PoP) structure/package and the method of forming the package are provided in accordance with various exemplary embodiments. The variations of the embodiments are discussed. Throughout the various views and illustrative embodiments, like reference numbers are used to designate like elements.

Figure 23:
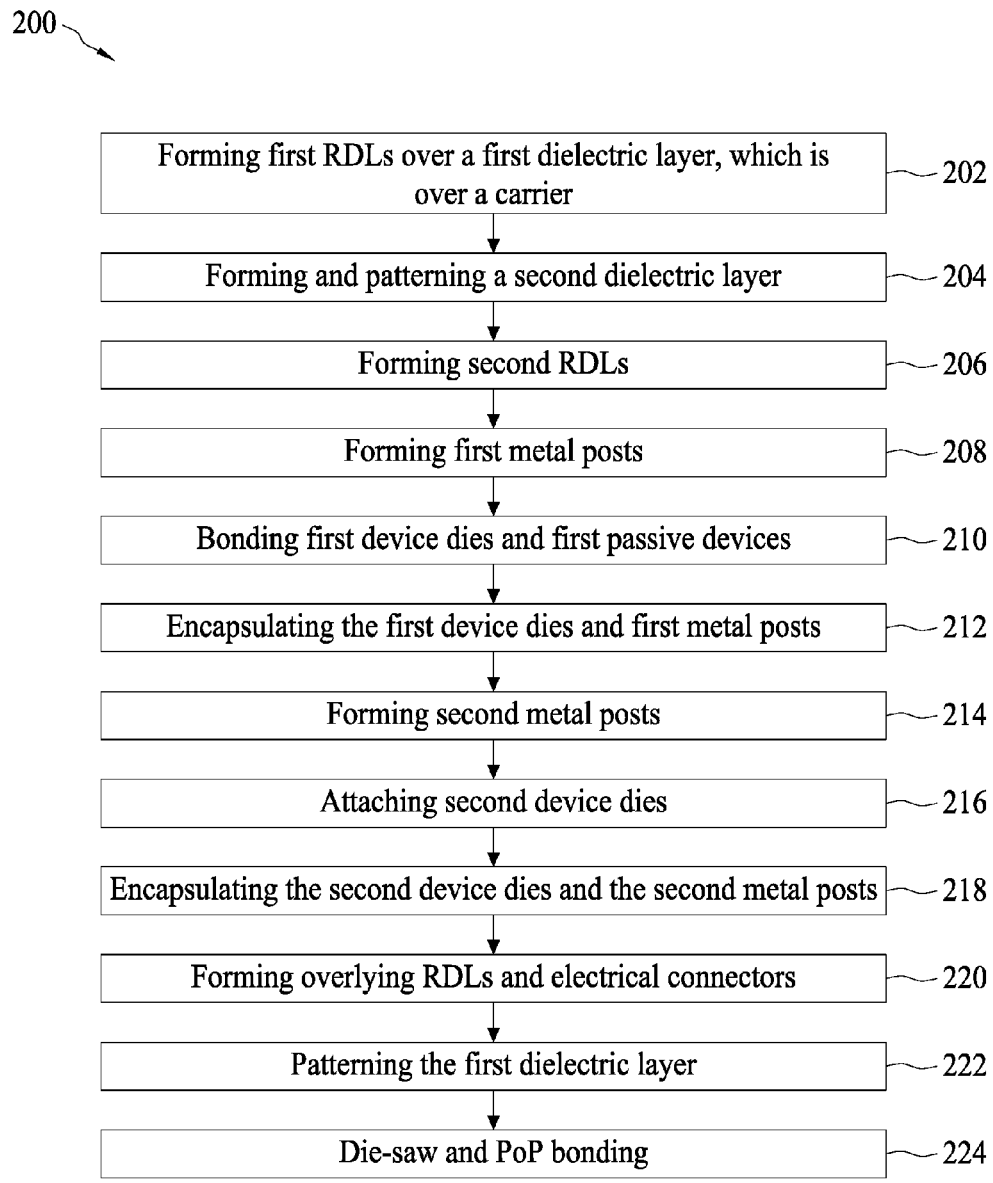
FIG. 23 illustrates a process flow for forming a PoP structure in accordance with some embodiments.

FIGS. 1 through 21 illustrate the cross-sectional views of intermediate stages in the formation a package in accordance with some embodiments. The steps shown in FIG. 1 through 21 are also illustrated schematically in the process flow 200 shown in FIG. 23.

FIG. 1 illustrates carrier 20 and release layer 22 formed on carrier 20. Carrier 20 may be a glass carrier, a ceramic carrier, or the like. Carrier 20 may have a round top-view shape, and may have a top-view shape and size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. In accordance with other embodiments, release layer 22 is formed of an ultra-violet (UV) glue. Release layer 22 may be dispensed as a liquid and cured. In accordance with alternative embodiments, release layer 22 is a laminate film laminated onto carrier 20. The top surface of release layer 22 is leveled and has a high degree of co-planarity.

Dielectric layer 24 is formed on release layer 22. In accordance with some embodiments of the present disclosure, dielectric layer 24 is formed of a polymer, which may also be a photo-sensitive material such as polybenzoxazole (PBO), polyimide, benzocyclobutene (BCB), or the like, which may be easily patterned through light-exposure and development. In accordance with alternative embodiments, dielectric layer 24 is formed of an inorganic material, for example, a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 2:
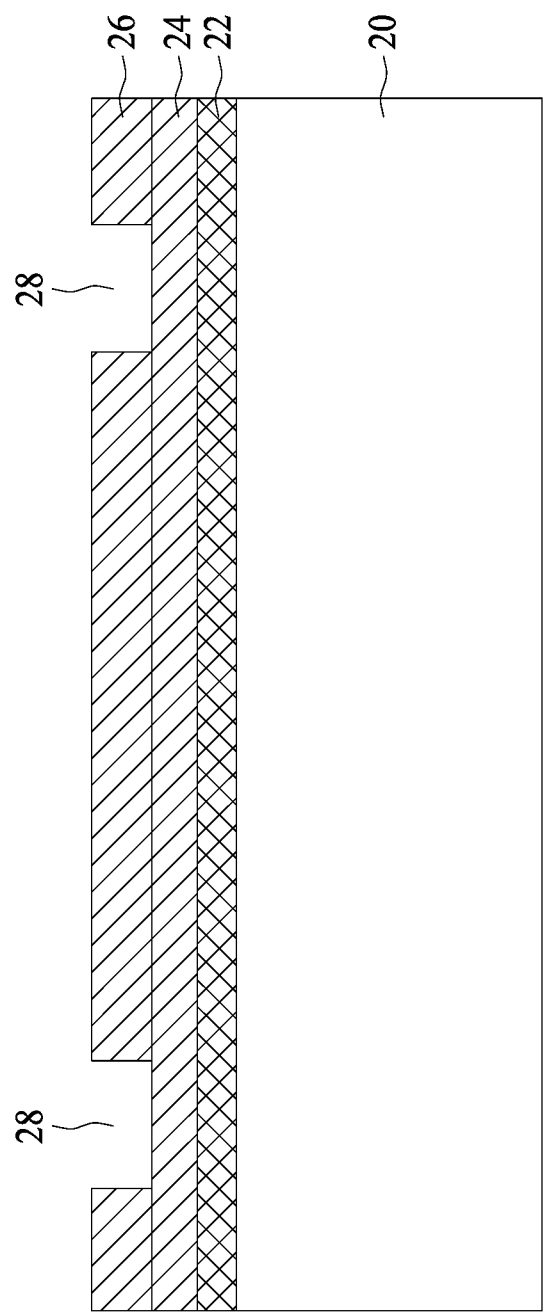
Figure 3:
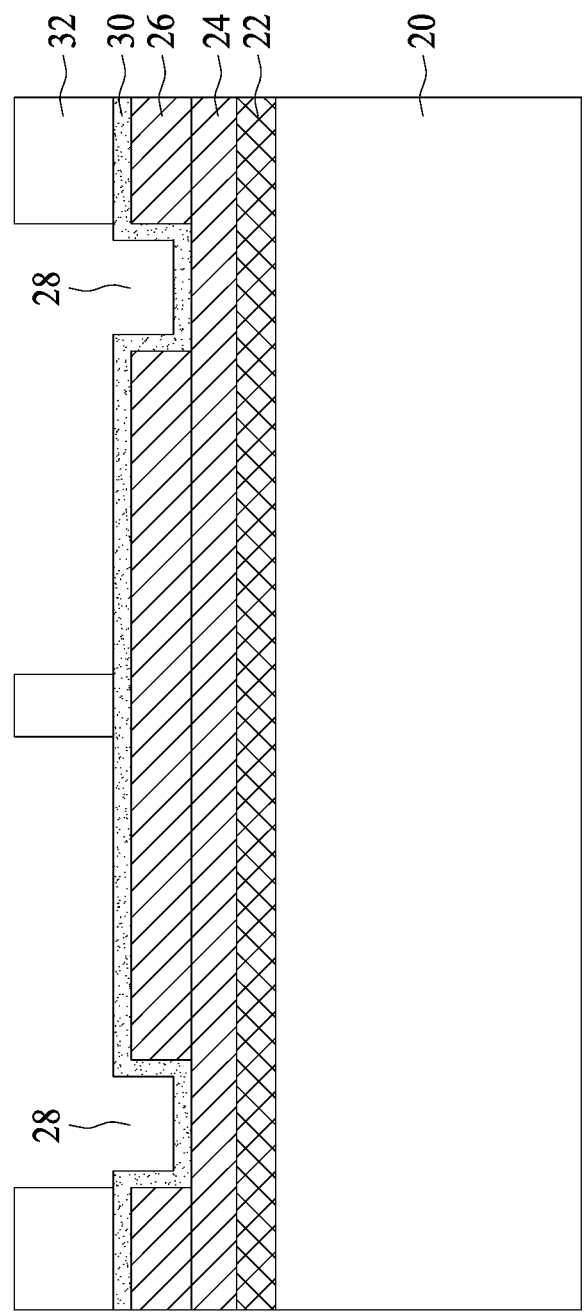
Figure 4:
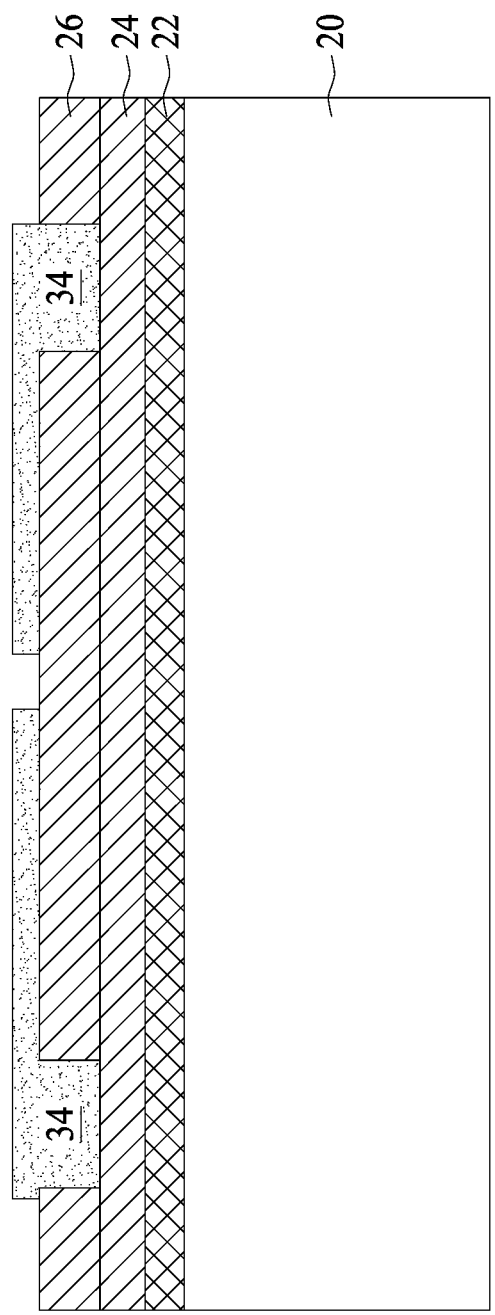

FIGS. 2 through 4 illustrate the formation of Redistribution Lines (RDLs). The respective step is shown as step 202 in the process flow shown in FIG. 23. Referring to FIG. 2, dielectric layer 26 is formed over dielectric layer 24. Dielectric layer 26 may be selected from the same group of candidate materials for forming dielectric layer 24. Furthermore, dielectric layer 26 may be formed of a material different from, or same as, the material of dielectric layer 24. Dielectric layer 26 is patterned to form openings 28, through which the underlying dielectric layer 24 is exposed.

Next, referring to FIG. 3, seed layer 30 is formed over dielectric layer 26. Portions of seed layer 30 further extend into openings 28. In accordance with some embodiments, seed layer 30 includes a titanium layer and a copper layer over the titanium layer. In accordance with alternative embodiments, seed layer 30 includes a single copper layer or a single copper alloy layer. Seed layer 30 may be formed using, for example, Physical Vapor Deposition (PVD). Patterned mask 32, which may be a photo resist, is formed over seed layer 30, and is then patterned to expose seed layer 30. Openings 28 are also exposed to the openings in the patterned mask 32.

Referring to FIG. 4, RDLs 34 are formed. The formation process includes performing a metal plating on the exposed seed layer 30. Patterned mask 32 (FIG. 3) is then removed. The plating may be performed using, for example, electroless plating. The portions of the seed layer 30 previously covered by patterned mask 32 are then removed in an etching step, leaving RDLs 34 as in FIG. 4.

Figure 5:
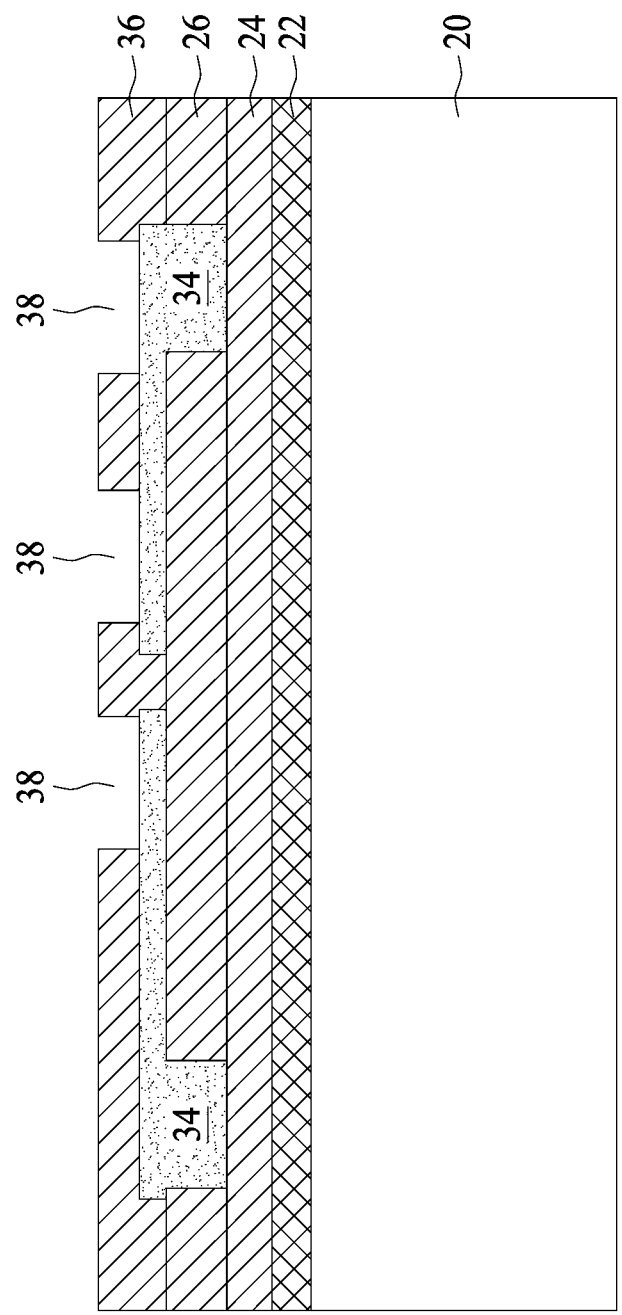

Referring to FIG. 5, dielectric layer 36 is formed and then patterned. The respective step is shown as step 204 in the process flow shown in FIG. 23. Dielectric layer 36 may or may not be formed of a material selected from the same group of candidate materials for forming dielectric layers 24 and/or 26, and may be formed of a polymer or an inorganic material. Dielectric layer 36 is then patterned, and some portions of RDLs 34 are exposed.

Figure 6:
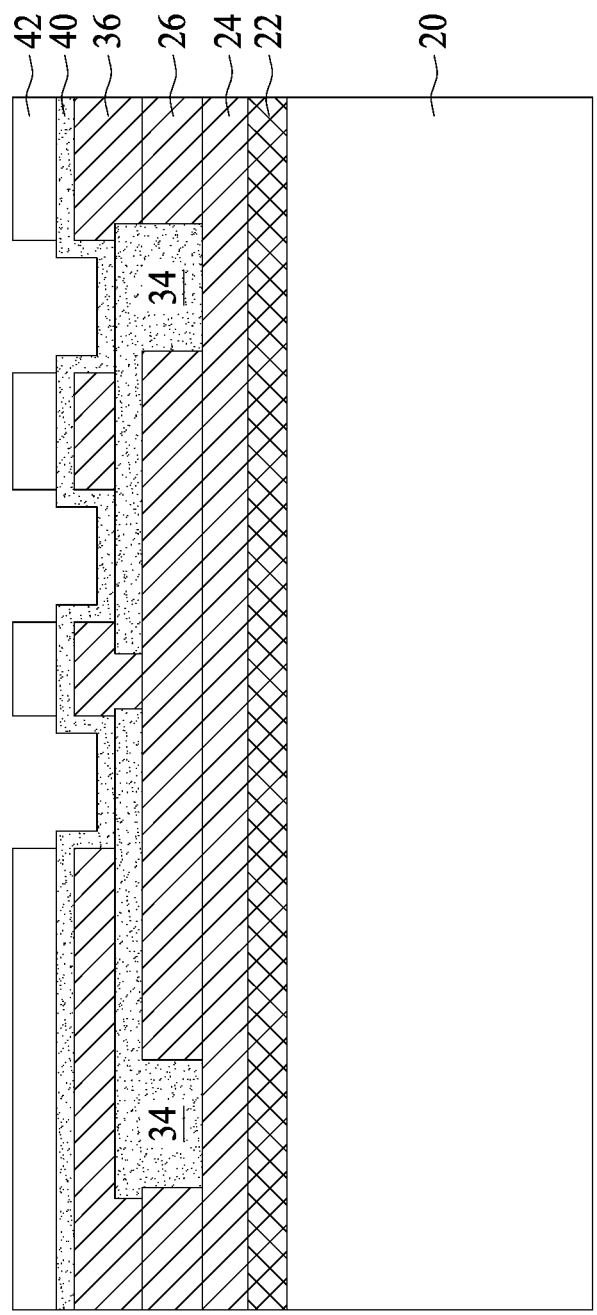

FIG. 6 illustrates the formation of seed layer 40 and the overlying patterned mask 42. The materials and the formation processes of seed layer 40 and patterned mask 42 are similar to the materials and the formation processes of seed layer 30 and patterned mask 32, and are not repeated herein.

Figure 7:
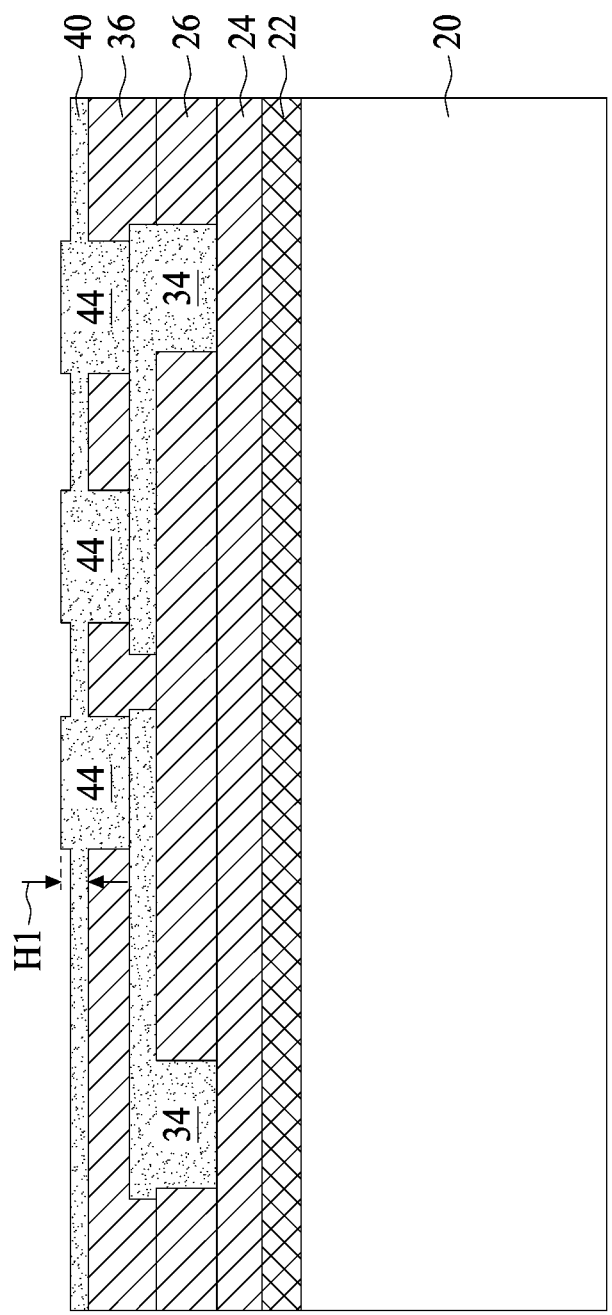

A plating process is then performed, forming RDLs 44 as shown in FIG. 7. The respective step is shown as step 206 in the process flow shown in FIG. 23. Patterned mask 42 as shown in FIG. 6 is then removed. In accordance with some embodiments, the top surfaces of the resulting RDLs 44 are higher than the top surface of dielectric layer 36. In accordance with some exemplary embodiments, height H1 of the portions of RDLs 44 over the top surface of dielectric layer 36 is in the range between about 20 µm and about 30 µm. After the removal of patterned mask 42, the portions of seed layer 40 covered by the removed pattern mask 42 are exposed. These portions of seed layer 40 are not removed, and are used for the subsequent formation of metal posts.

Figure 8:
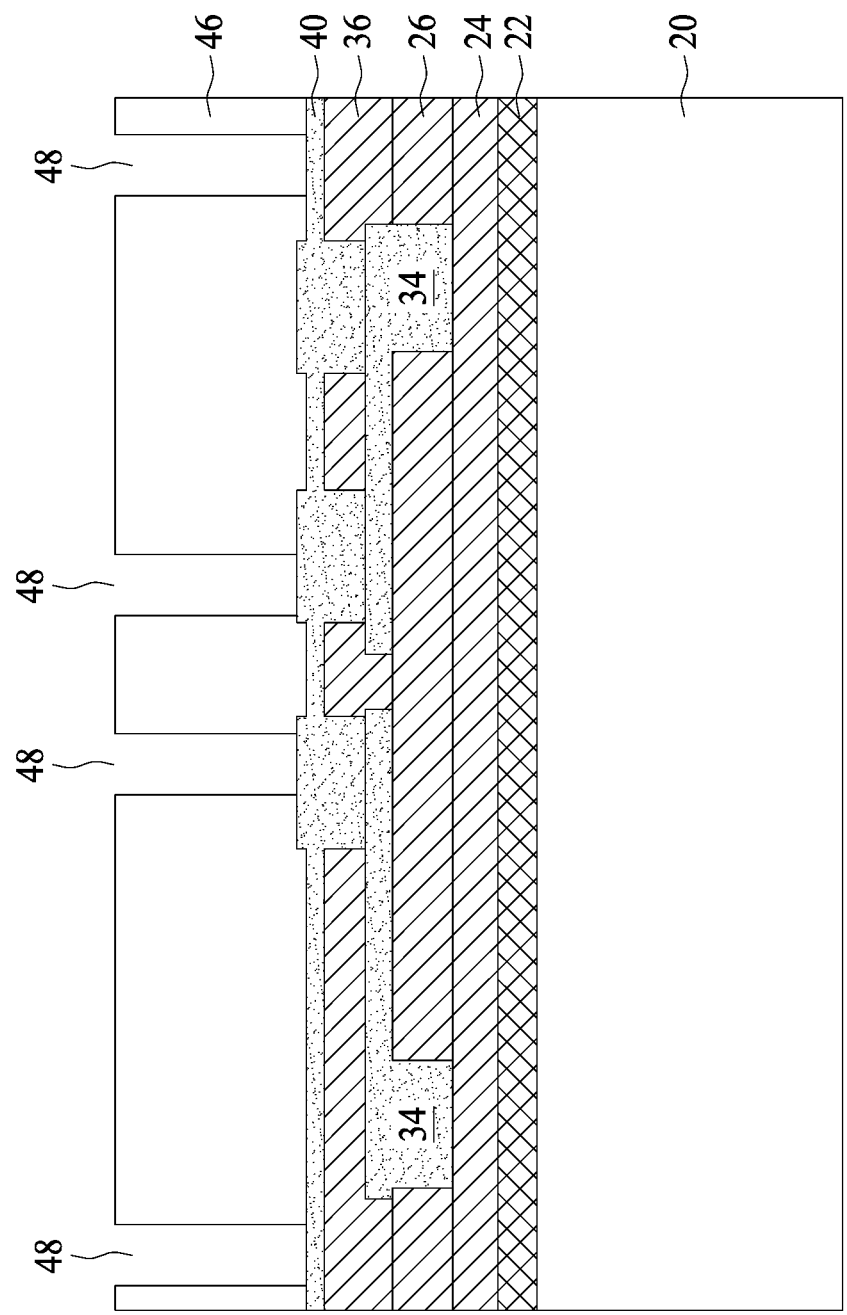
Figure 9:
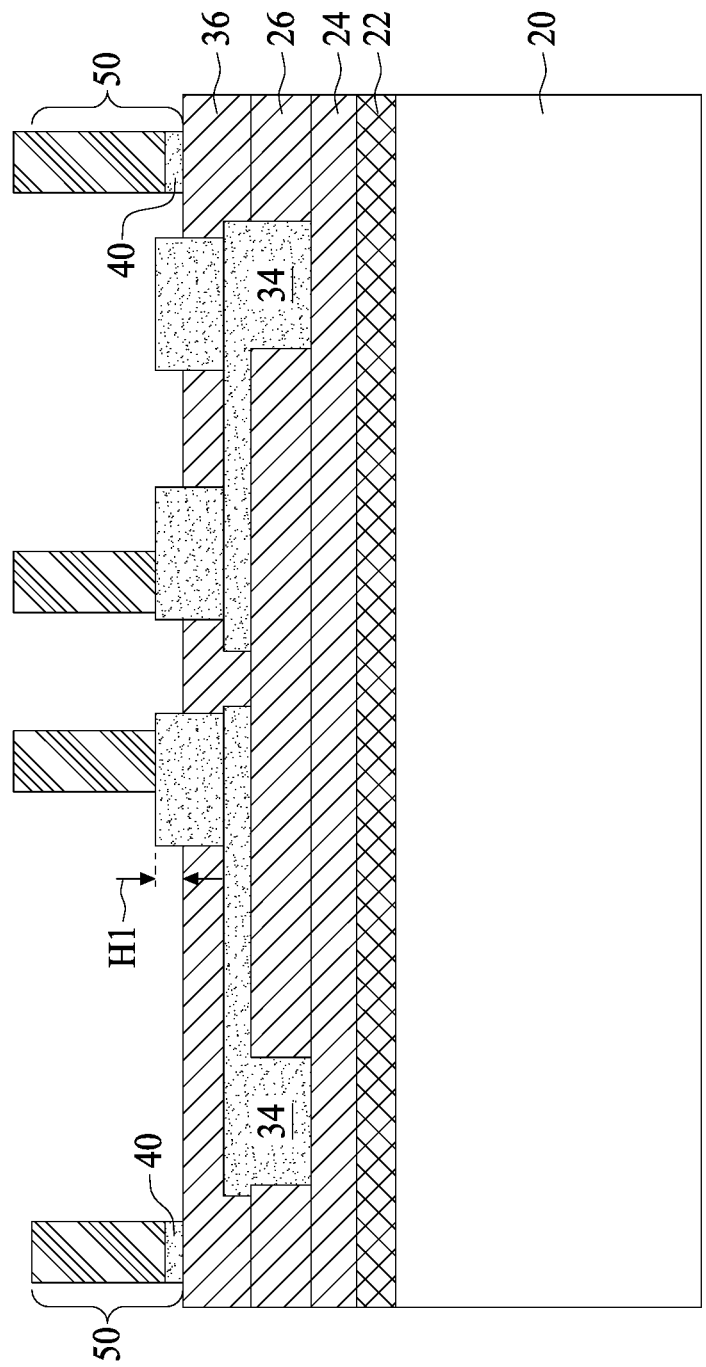

Referring to FIG. 8, patterned mask 46, which may be formed of a photo resist, is formed and patterned, and openings 48 are formed in the patterned mask 46. Some portions of seed layer 40 and some portions of RDLs 44 are exposed. A plating step is then performed to form metal posts 50, as shown in FIG. 9. The respective step is shown as step 208 in the process flow shown in FIG. 23. After the plating, patterned mask 46 is removed, followed by the removal of the portions of seed layer 40 previously covered by patterned mask 46. The resulting structure is shown in FIG. 9. It is appreciated that although some metal posts 50 are shown as being discrete, these metal posts are actually connected to some portions of RDLs 44, which portions are not in the illustrated plane. Throughout the description, the remaining portions of seed layer 40 are construed as parts of the corresponding RDLs 44 and metal posts 50.

In the previous process steps, the same seed layer 40 is used to perform two plating processes, with the two plating processes performed using different masks. The first plating process is shown in FIG. 6 to FIG. 7, and the second plating process is shown in FIG. 8 to FIG. 9. Sharing the same seed layer by two plating processes advantageously saves the manufacturing cost.

FIGS. 10 through 20 illustrate the subsequent steps for forming the PoP package. In subsequent figures, the details of dielectric layers 26 and 36 and RDLs 34 and 44 are shown schematically, while the details of these features may be found referring to FIGS. 1 through 9.

Figure 10:
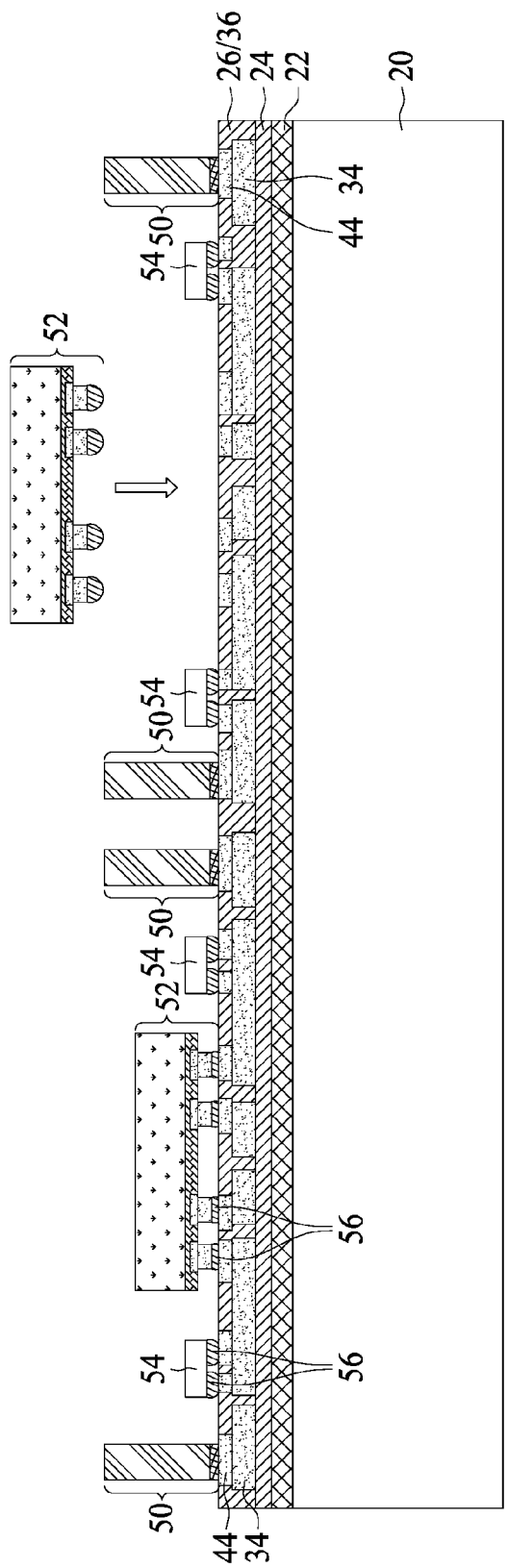

FIG. 10 illustrates the placement of device dies 52 and passive devices 54. The respective step is shown as step 210 in the process flow shown in FIG. 23. In accordance with some embodiments of the present disclosure, device dies 52 are memory dies such as Dynamic Random Access Memory (DRAM) dies. In accordance with alternative embodiments, device dies 52 are logic dies such as Application Processor (AP) dies. Passive devices 54 may include, for example, capacitors, resistors, inductors, or the like. When device dies 52 are DRAM dies, passive devices 54 may include the capacitors that are used for stabilizing the power supply voltages of device dies 52. Device dies 52 and passive devices 54 include solder regions 56 in contact with RDLs 44.

Figure 11:
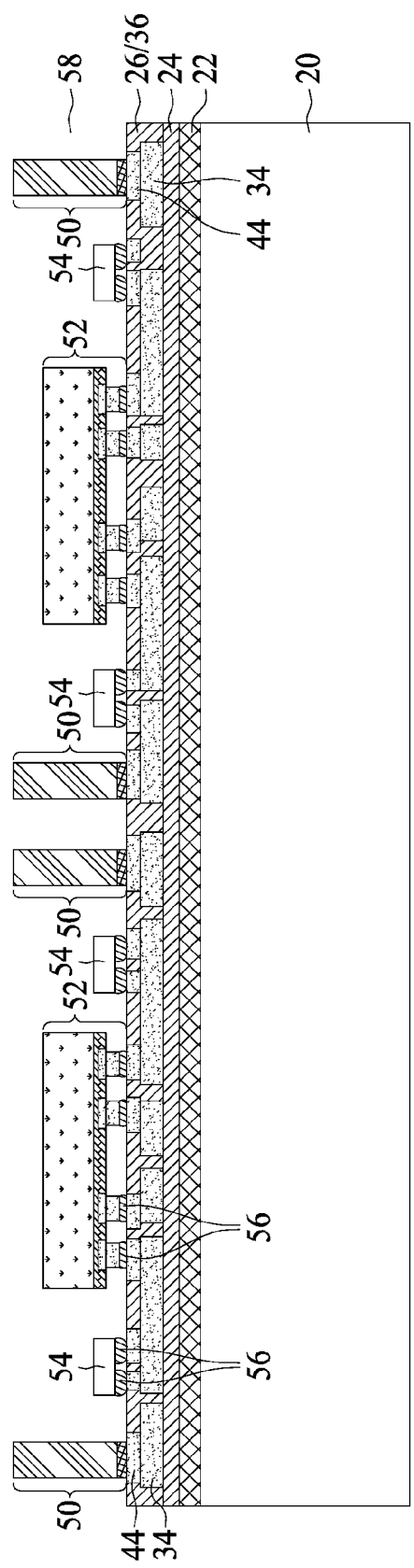
Figure 12:
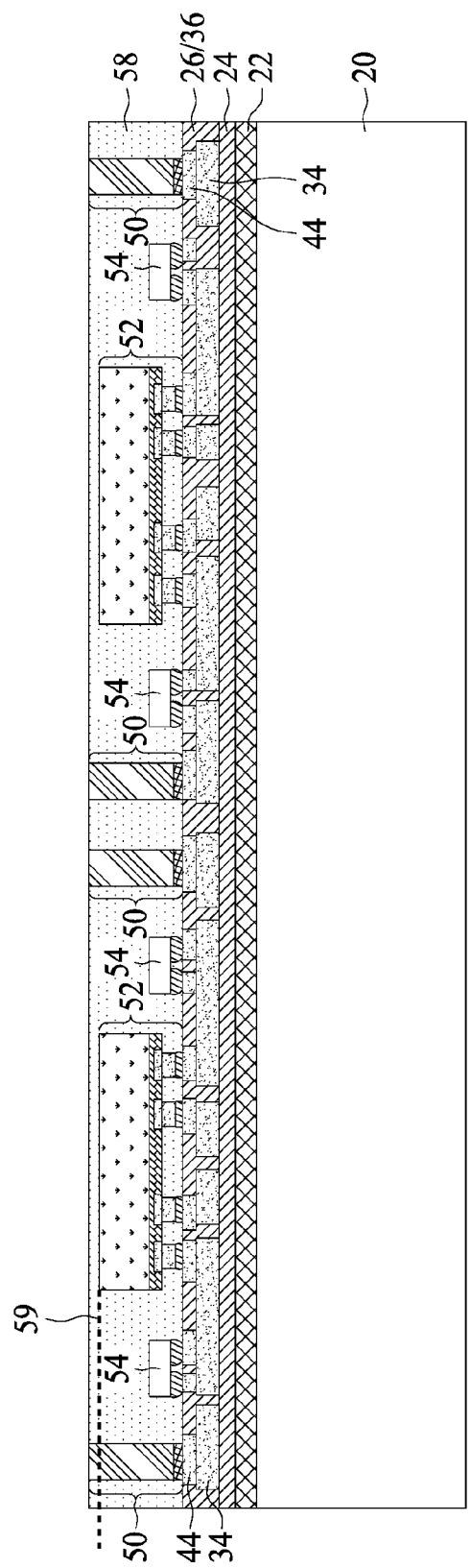

Next, as shown in FIG. 11, a reflow process is performed, and solder regions 56 are reflowed to bond device dies 52 and passive devices 54 to RDLs 44. Device dies 52, passive devices 54, and metal posts 50 are then encapsulated in encapsulating material 58, as shown in FIG. 12. The respective step is shown as step 212 in the process flow shown in FIG. 23. Encapsulating material 58 may be a molding compound, and hence is referred to as molding compound 58 throughout the description. Molding compound 58 may also be a molding underfill, an epoxy, and/or a resin. Molding compound 58 fills the gaps between neighboring metal posts 50 and the gaps between metal posts 50 and device dies 52. The top surface of molding compound 58 is higher than the top ends of metal posts 50.

Next, a planarization step such as a Chemical Mechanical Polish (CMP) or a mechanical grinding process is performed to thin molding compound 58, until metal posts 50 are exposed. The resulting structure is shown in FIG. 12. Due to the grinding, the top ends of metal posts 50 are substantially level (coplanar) with the top surface of molding compound 58. In accordance with some embodiments, a thin layer of molding compound 58 is left to cover device dies 52 after the planarization is finished. In accordance with alternative embodiments, after the planarization, the back surface of device dies 52 are exposed, wherein dashed line 59 is illustrated to show the resulting top surface of molding compound 58 in accordance with these embodiments.

Figure 13:
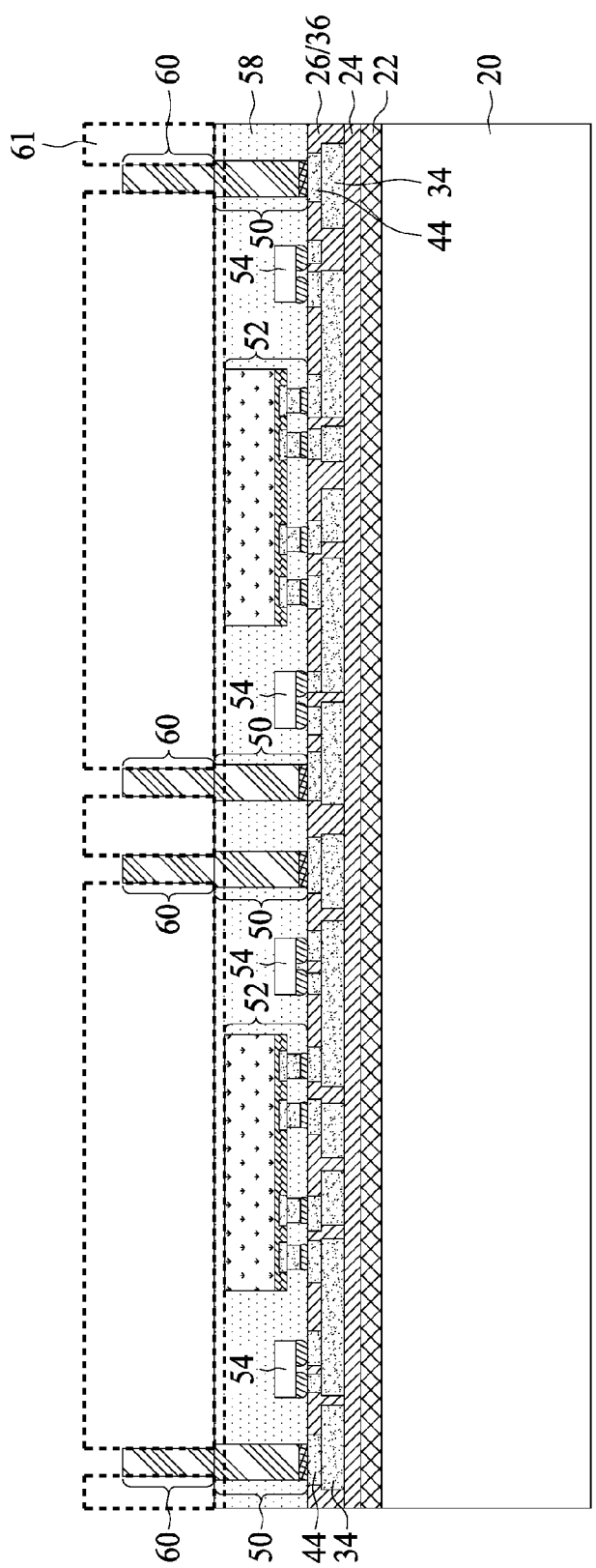

FIG. 13 illustrates the formation of metal posts 60 on the top of metal posts 50. The respective step is shown as step 214 in the process flow shown in FIG. 23. The formation process may include forming mask 61 such as a photo resist, and exposing and developing/etching the mask to form openings, wherein the center portions of metal posts 50 are exposed to the openings in the patterned mask 61. The openings have top-view sizes smaller than the top-view sizes of metal posts 50. Accordingly, metal posts 50 can be used as the seed layer for plating metal posts 60. Patterned mask 61 is then removed. In the resulting structure, metal posts 50 laterally extends beyond the edges of the respective overlaying metal posts 60, with the lateral sizes of metal posts 50 abruptly transition to the lateral sizes of metal posts 60. Metal posts 60 may be formed of a homogenous material such as copper or a copper alloy.

Figure 14:
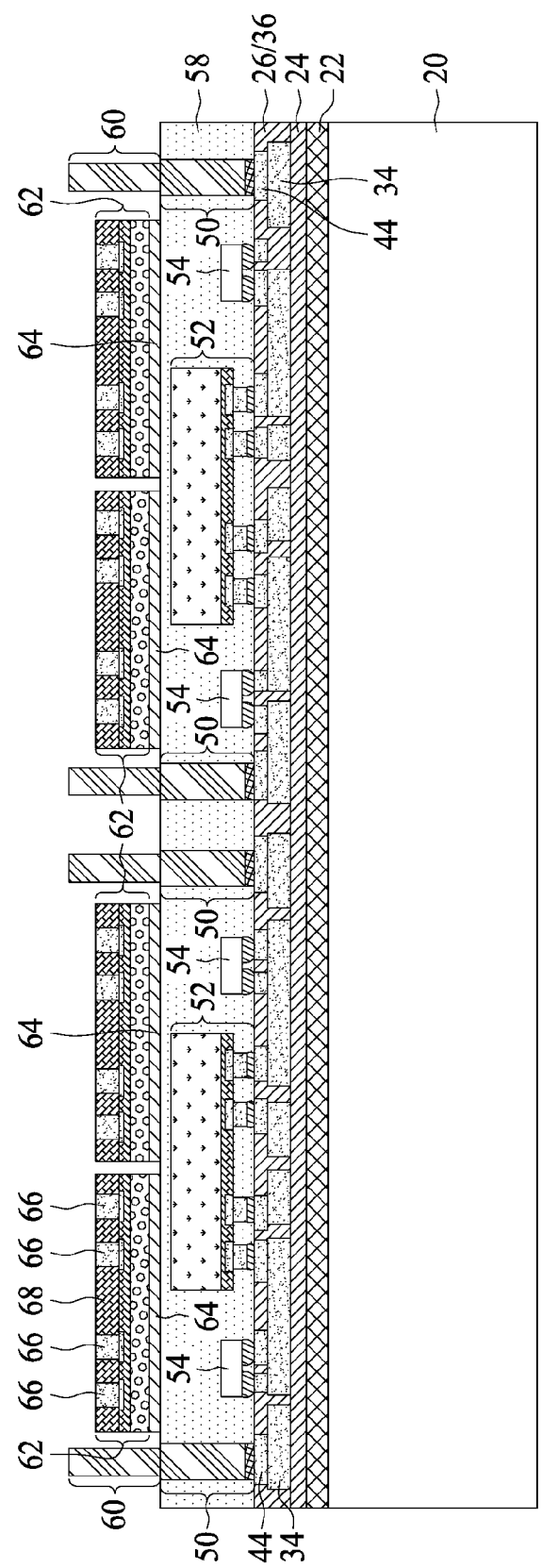

FIG. 14 illustrates the attachment of device dies 62, wherein the back surfaces of device dies 62 face the back surface of device dies 52. The respective step is shown as step 216 in the process flow shown in FIG. 23. Device dies 62 may be adhered to molding compound 58 and/or the back surface of device dies 52 through die-attach films 64. The edges of die-attach film 64 are co-terminus with (vertically aligned to) the respective edges of the device dies 62. Die-attach films 64 are adhesive films that are adhered to device dies 62 before being attached to molding compound 58. Device dies 62 may include semiconductor substrates having back surfaces (the surface facing down) in physical contact with die-attach films 64. Device dies 62 further include integrated circuit devices (such as active devices, which include transistors, for example, not shown) at the front surface (the surface facing up) of the semiconductor substrates. In accordance with some exemplary embodiments, device dies 62 are application processor dies, which are logic dies such as Central Processing Unit (CPU) dies, Graphic Processing Unit (GPU) dies, mobile application dies, or the like. Furthermore, each pair of device dies 62 overlapping the same device die 52 may include a digital die and an analog die.

Device dies 62 may include metal pillars 66 at their top surfaces. Metal pillars 66 are electrically coupled to the integrated circuits inside device dies 62. Metal pillars 66 may be copper pillars, and may also include other conductive/metallic materials such as aluminum, nickel, or the like. In accordance with some exemplary embodiments of the present disclosure, as shown in FIG. 14, metal pillars 66 are in dielectric layer 68, and the top surfaces of metal pillars 66 are coplanar with the top surface of dielectric layer 68. In accordance with alternative embodiments of the present disclosure, metal pillars 66 are embedded in dielectric layers 68, with the top surface of the respective dielectric layer 68 being higher than the top surfaces of metal pillars 66. Dielectric layers 68 may be formed of a polymer, which may include PBO, polyimide, or the like.

Figure 15:
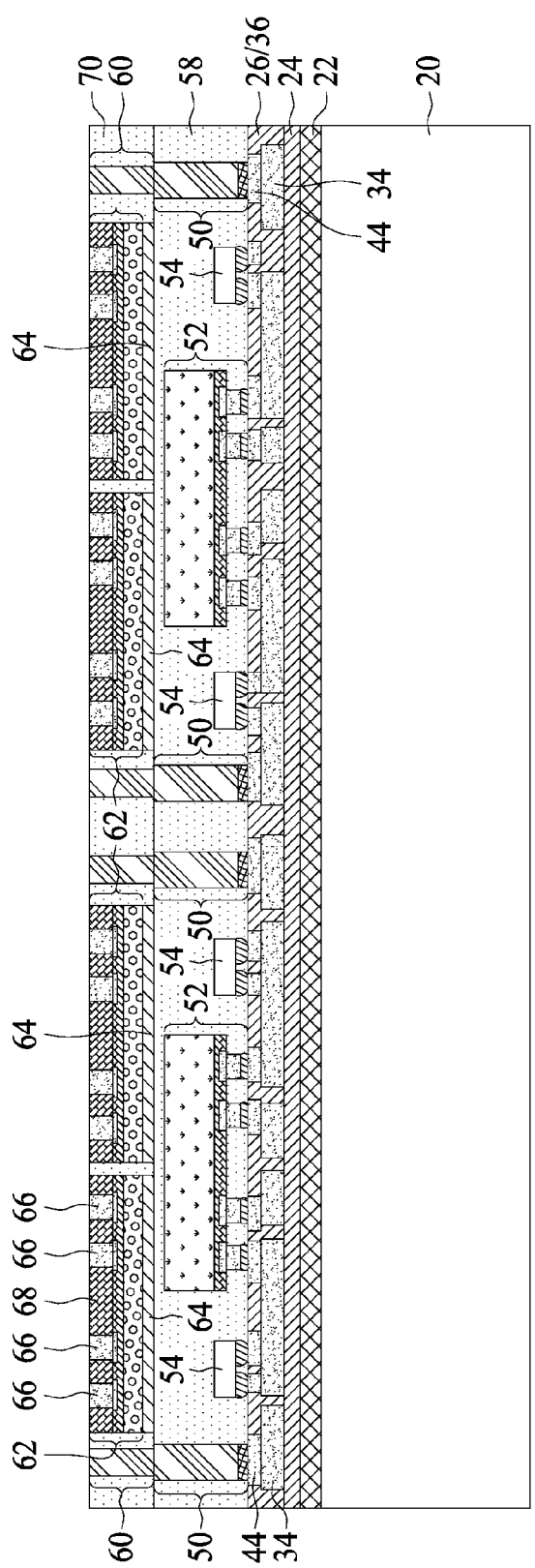

Referring to FIG. 15, encapsulating material 70 is encapsulated/molded on device dies 62 and metal posts 60. The respective step is shown as step 218 in the process flow shown in FIG. 23. Encapsulating material 70 may include a molding compound, a molding underfill, an epoxy, and/or a resin. After the molding process, the top surface of encapsulating material 70 is higher than the top ends of metal pillars 66 and metal posts 60. Next, a planarization step such as a CMP step or a mechanical grind step is performed to planarize encapsulating material 70, until metal posts 60 and metal pillars 66 are exposed. Due to the planarization, the top surfaces of metal posts 60 are substantially level (coplanar) with the top surfaces of metal pillars 66, and are substantially level (coplanar) with the top surface of encapsulating material 70.

Figure 16:
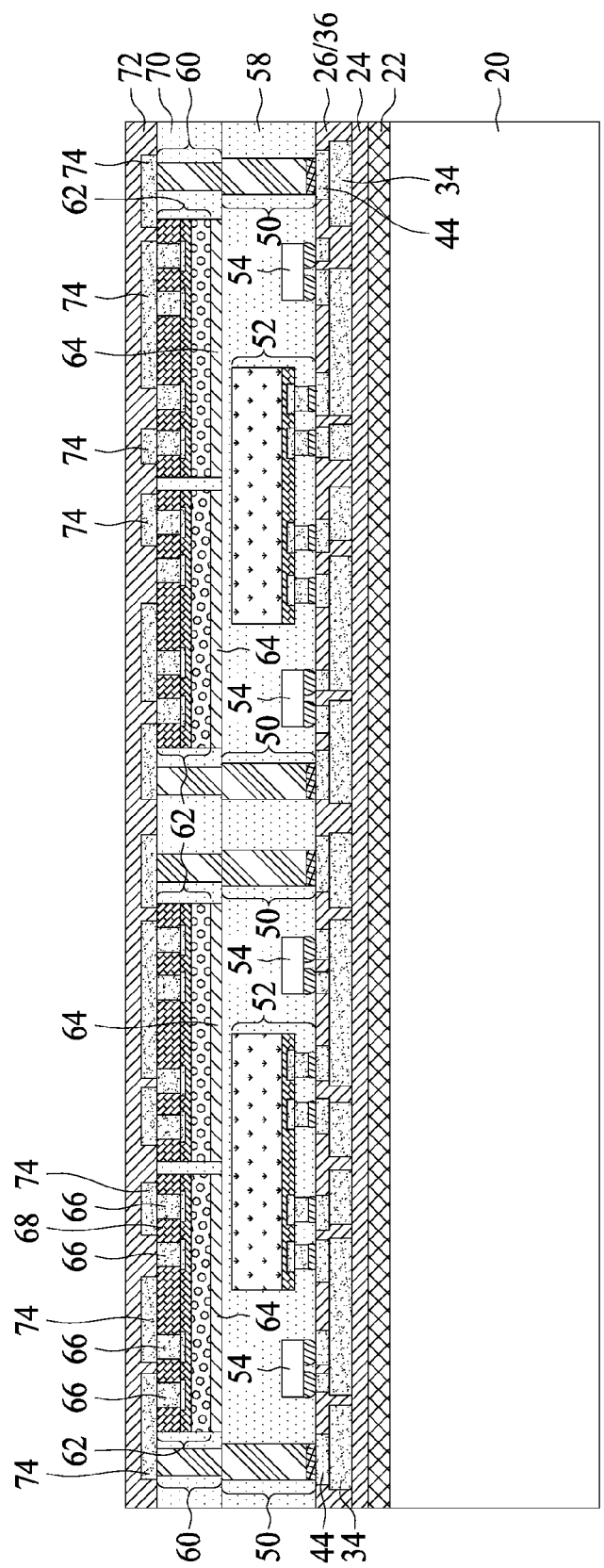

Referring to FIG. 16, one or more layers of dielectric layers 72 and the respective RDLs 74 are formed over encapsulating material 70, metal posts 60, and metal pillars 66. The respective step is shown as step 220 in the process flow shown in FIG. 23. In accordance with some embodiments of the present disclosure, dielectric layers 72 are formed of a polymer(s) such as PBO, polyimide, or the like. In accordance with alternative embodiments of the present disclosure, dielectric layers 72 are formed of an inorganic dielectric material(s) such as silicon nitride, silicon oxide, silicon oxynitride, or the like.

RDLs 74 are formed to electrically couple to metal pillars 66 and metal posts 60. RDLs 74 may also interconnect metal pillars 66 and metal posts 60 with each other. RDLs 74 may include metal traces (metal lines) and vias underlying and connected to the metal traces. In accordance with some embodiments of the present disclosure, RDLs 74 are formed through plating processes, wherein each of RDLs 74 includes a seed layer (not shown) and a plated metallic material over the seed layer. The seed layer and the plated metallic material may be formed of the same material or different materials.

Figure 17:
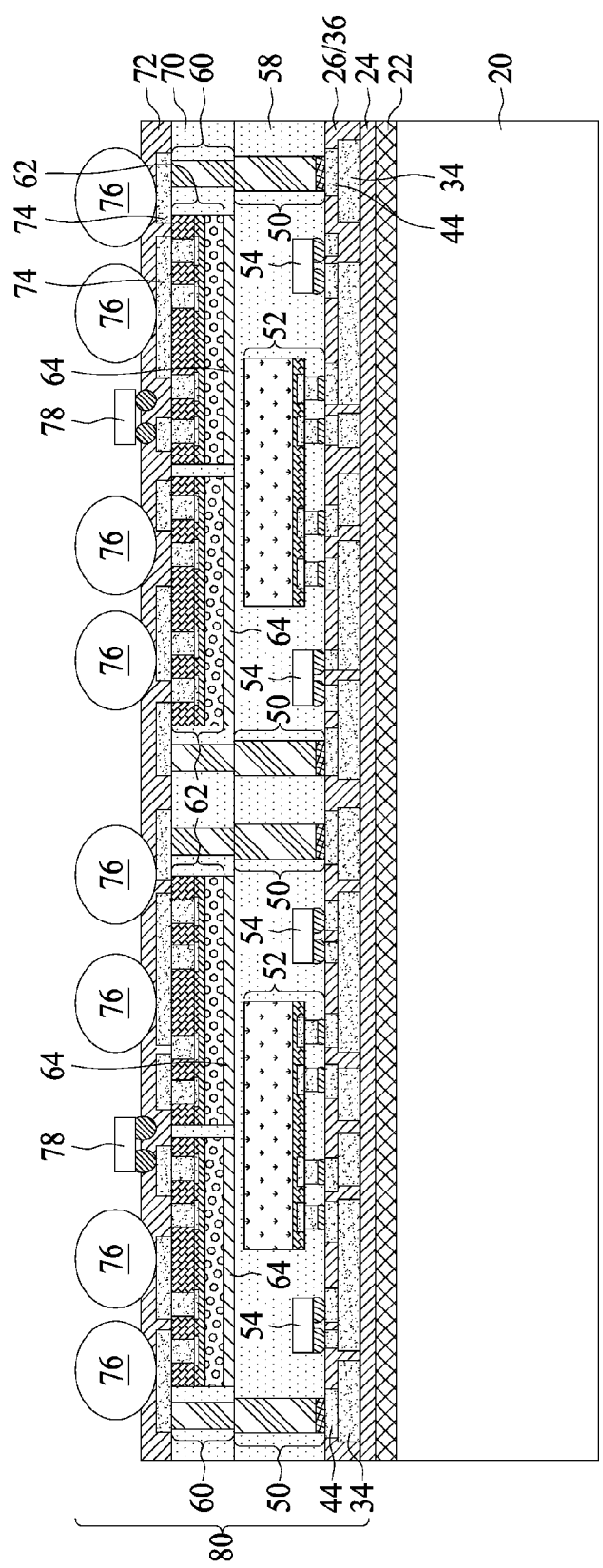

FIG. 17 illustrates the formation of electrical connectors 76 in accordance with some exemplary embodiments of the present disclosure. The respective step is also shown as step 220 in the process flow shown in FIG. 23. Electrical connectors 76 are electrically coupled to RDLs 74, metal pillars 66, and/or metal posts 60. The formation of electrical connectors 76 may include placing solder balls over RDLs 74 and then reflowing the solder balls. In accordance with alternative embodiments of the present disclosure, the formation of electrical connectors 76 includes performing a plating step to form solder regions over RDLs 74 and then reflowing the solder regions. Electrical connectors 76 may also include metal pillars, or metal pillars and solder caps, which may also be formed through plating. Throughout the description, the combined structure including device dies 62, metal posts 60, encapsulating material 70, RDLs 74, and dielectric layers 72 are referred to as package 80, which may be a composite wafer.

Passive devices 78 are also bonded to RDLs 74. Passive devices 78 may include capacitors, resistors, inductors, or the like, and may be discrete devices in which no active devices such as transistors and diodes are formed.

Figure 18:
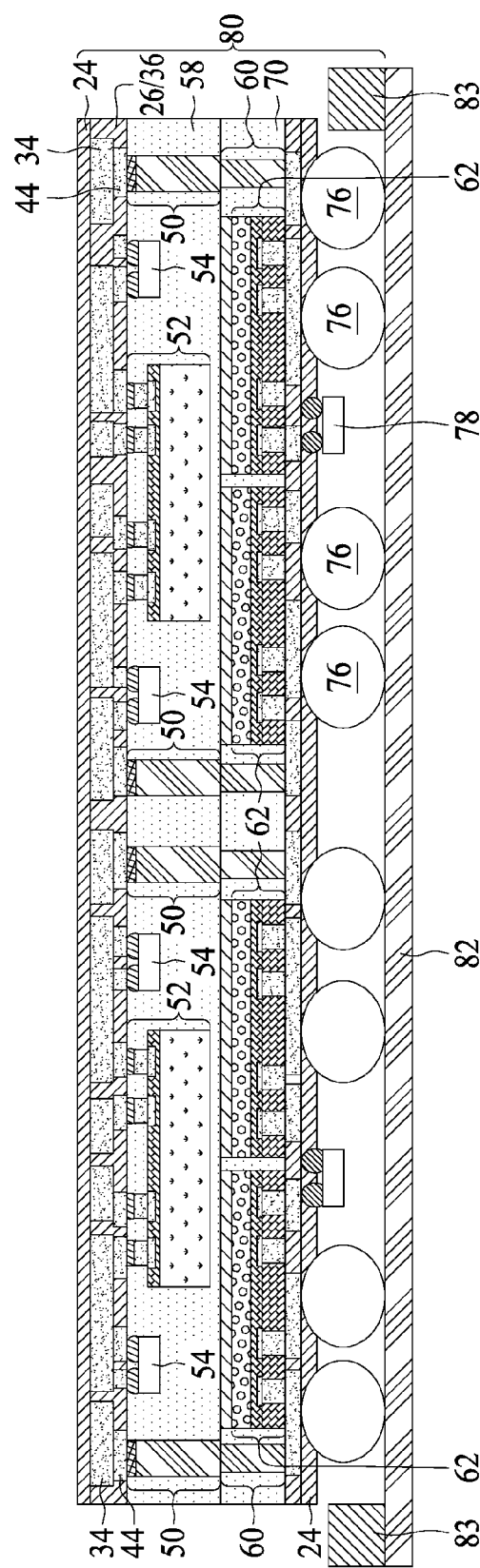

Next, package 80 is de-bonded from carrier 20. In accordance with some exemplary de-boding process, dicing tape 82 (FIG. 18) is attached to package 80 to protect electrical connectors 76, wherein dicing tape 82 is fixed to dicing frame 83. The de-bonding is performed, for example, by projecting a UV light or a laser on release layer 22 (FIG. 17). For example, when release layer 22 is formed of LTHC, the heat generated from the light or laser causes the LTHC to be decomposed, and hence carrier 20 is detached from package 80. The resulting structure is shown in FIG. 18.

Figure 19:
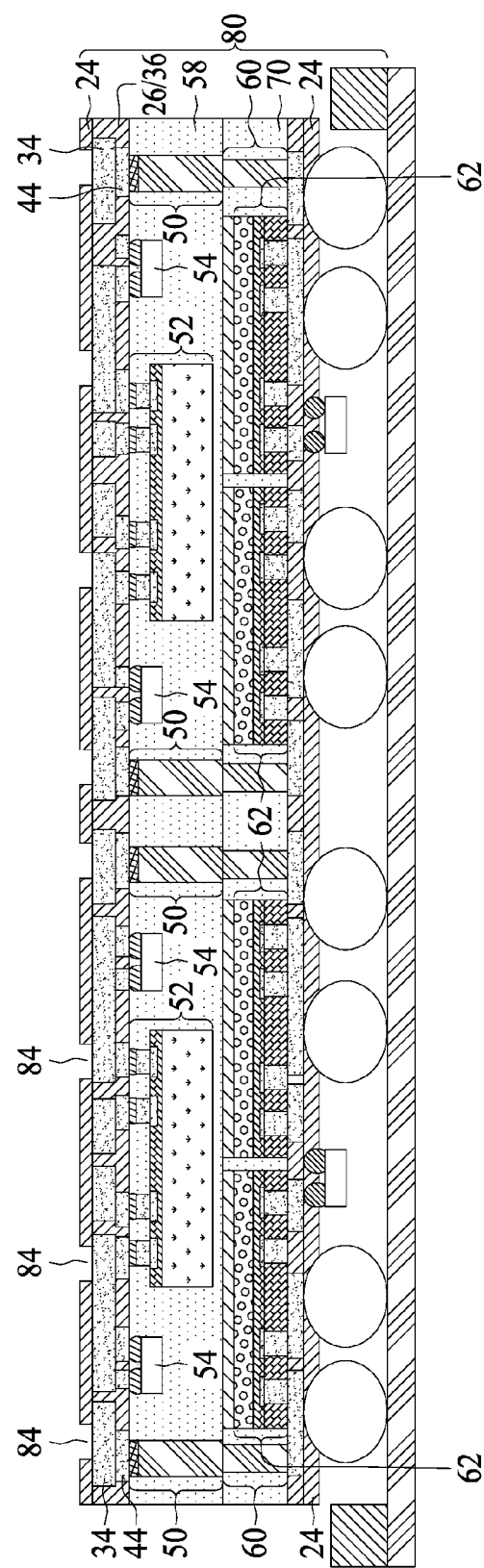

FIG. 19 illustrates the patterning for forming openings 84 in dielectric layer 24. The respective step is shown as step 222 in the process flow shown in FIG. 23. For example, dielectric layer 24 may be patterned using laser drill to remove the portions overlapping some metal pads in RDLs 74, so that the metal pads are exposed through openings 84.

Figure 20:
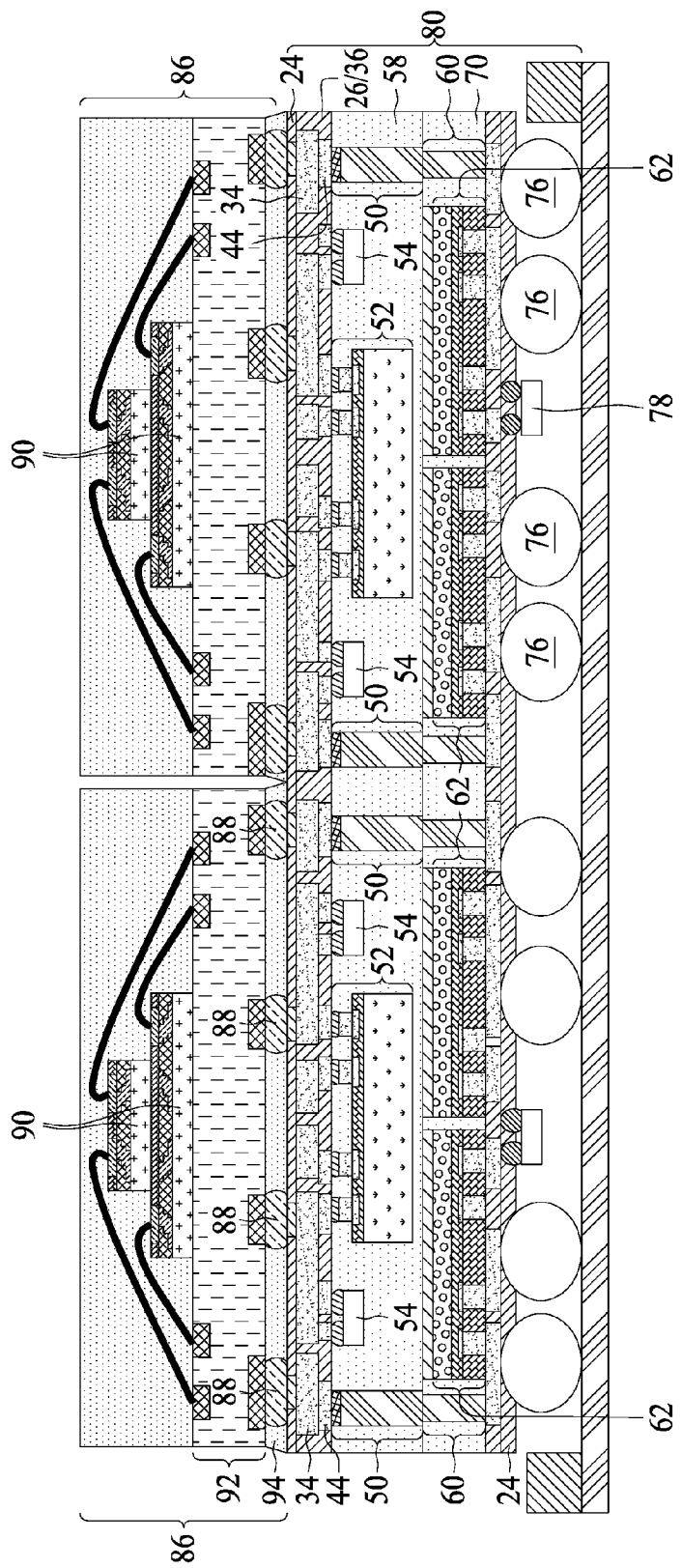

FIG. 20 illustrates the bonding of package 86 to package 80, hence forming PoP packages. The respective step is shown as step 224 in the process flow shown in FIG. 23. Packages 86 and 80 are also referred to as a top package and a bottom package, respectively, of the PoP package. The bonding is performed through solder regions 88, which join RDLs 44 to the metal pads in the overlying package 86. In accordance with some embodiments of the present disclosure, package 86 includes device die(s) 90, which may be memory dies such as flash memory dies, Static Random Access Memory (SRAM) dies, Dynamic Random Access Memory (DRAM) dies, or the like. The memory dies may also be bonded to package substrate 92 in accordance with some exemplary embodiments.

Figure 21:
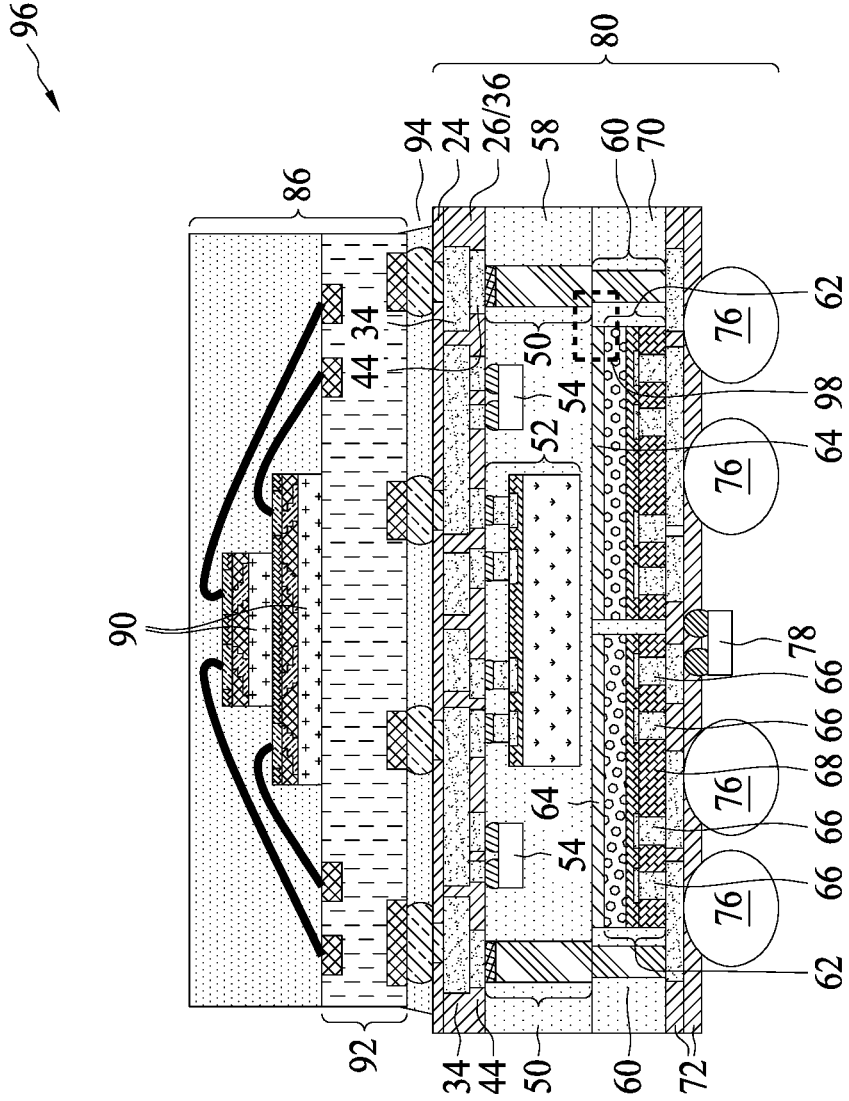

After the bonding of top package 86 to bottom package 80, underfill 94 is disposed into the gap between top package 86 and bottom package 80. In subsequent steps, the package as shown in FIG. 20 is sawed apart into a plurality of packages. One of the resulting packages 96 is illustrated in FIG. 21. The respective step is also shown as step 224 in the process flow shown in FIG. 23.

In the packages shown in FIGS. 20 and 21, device dies 52 and device dies 62 are placed back-to-back. In accordance with some embodiments, there is a layer of encapsulating material 58 separating device dies 52 from the respective device dies 62. When device dies 62 are application processor dies, their temperatures are typically high during operation, sometimes as high as 110° C. The memory dies such as device dies 52, on the other hand, cannot sustain such a high temperature, and may be damaged by the heat dissipated from device dies 62. Advantageously, the layer of encapsulating material 58 may act as a heat insulating layer functioning to reduce the amount of heat dissipated from device dies 62 to device dies 52. In accordance with other embodiments, DAFs 64 are in direct contact with the back surfaces of device dies 52, for example, when the heat dissipated from dies 52 and 62 does not significantly affect each other.

Figure 22:
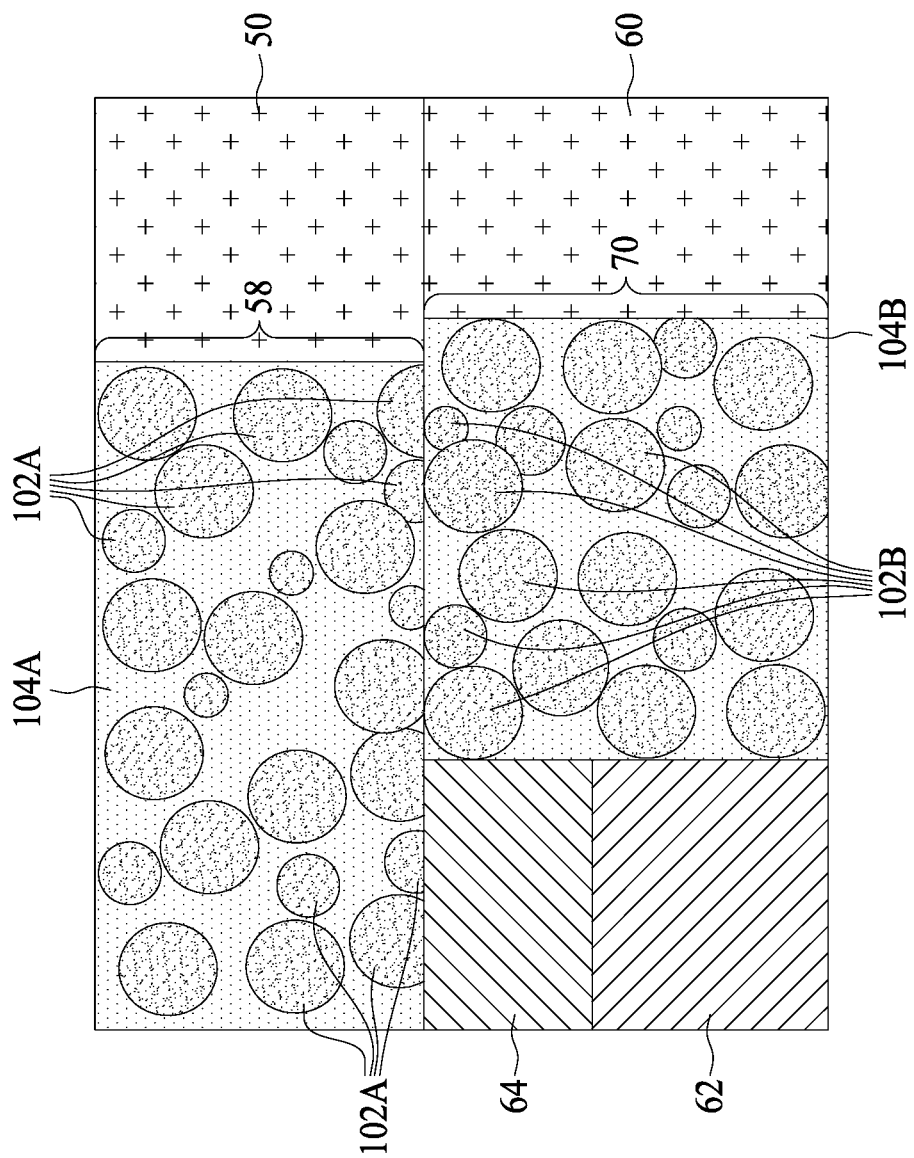
FIG. 22 illustrates a cross-sectional view of a part of a package in accordance with some embodiments.

The interface between encapsulating material 58 and 70 is distinguishable, regardless of whether encapsulating material 58 and 70 are the same as each other or different from each other. For example, FIG. 22 illustrates an amplified view of region 98 (FIG. 21) in package 96. It is appreciated that each of encapsulating materials 58 and 70 may include a base material, which may be a polymer, a resin, an epoxy, or the like, and filler particles in the base material. The filler particles may be dielectric particles of $SiO_2$, $Al_2O_3$, or the like. For example, encapsulating material 58 may include base material 104A and filler particles 102A, and encapsulating material 70 may include base material 104B and filler particles 102B. The filler particles 102A and 102B may have rounded surfaces, which may be spherical. Due to the planarization as shown in FIG. 12, particles 102A are also ground to have planar surfaces. Accordingly, the ground particles 102A may include spherical surfaces inside base material 104A and planar surfaces contacting DAF 64 and encapsulating material 70. The side of encapsulating material 70 facing encapsulating material 58, on the other hand, is not planarized. Accordingly, the particles 102B that are in physical contact with encapsulating material 58 are not ground, and hence will have their round/spherical surfaces contacting encapsulating material 58. The ground filler particles may thus be used to determine which of the encapsulating materials 58 and 70 has been ground, and where the grounded surfaces are. In addition, encapsulating materials 58 and 70 may also be formed of different materials, and hence their interface may be determined through the difference in their materials. Similar, the ground surface of encapsulating material 70 (refer to FIG. 15) may have similar characteristic, and the ground surface is distinguishable.

The embodiments of the present disclosure have some advantageous features. Although the PoP package has three layers in total, only two encapsulating materials are used for encapsulating. Since the encapsulating materials have different Coefficients of Thermal Expansion (CTEs), the more layers of encapsulating materials are used, the higher the warpage the resulting package will have. Accordingly, by encapsulating two layers (rather than three layers) of device dies using two encapsulating materials, the warpage of package 80 (FIG. 19) is significantly reduced. The third layer of device dies are bonded to the bottom packages through solder bonding. Furthermore, the bonding is performed after package 80 is finished, and hence does not contribute significant warpage to the resulting package.

In addition, device dies 90 (FIGS. 20 and 21) are integrated into the PoP package in final steps, and hence device dies 90 do not suffer from the thermal budget in the preceding packaging process. For example, the curing of the polymer layers and the curing of encapsulating materials may be performed at temperatures higher than about 200° C. (such as around 230° C.), which temperature may damage flash memories. Accordingly, flash memory dies 90 may be incorporated into packages 86 to avoid the thermal budget, and hence the yield of the packaging is improved.

In accordance with some embodiments of the present disclosure, a method includes forming a first plurality of redistribution lines, forming a first metal post over and electrically connected to the first plurality of redistribution lines, and bonding a first device die to the first plurality of redistribution lines through flip-chip bonding. The first metal post and the first device die are encapsulated in a first encapsulating material. The first encapsulating material is planarized until the first metal post is exposed. The method further includes forming a second metal post over and connected to the first metal post, attaching a second device die to the first encapsulating material through an adhesive film, encapsulating the second metal post and the second device die in a second encapsulating material, planarizing the second encapsulating material until the second metal post and metal features on a surface of the second device die are exposed, and forming a second plurality of redistributions over and electrically coupling to the second metal post and the second device die.

In accordance with some embodiments of the present disclosure, a method includes encapsulating a first device die and a first metal post in a first encapsulating material, and planarizing the first encapsulating material to expose the first metal post. A layer of the first encapsulating material is left to be directly overlying the first device die. A patterned mask layer is formed over the first encapsulating material, with a center portion of the first metal post being exposed through an opening in the patterned mask layer. A second metal post is plated in the opening. The patterned mask layer is then removed. The method further includes attaching a second device die to the first encapsulating material through an adhesive film, encapsulating the second device die and the second metal post in a second encapsulating material, and forming a second plurality of redistributions over and electrically coupling to the second metal post and metal pillars of the second device die.

In accordance with some embodiments of the present disclosure, a package includes a first plurality of redistribution lines, a first encapsulating material, and a first metal post penetrating through the first encapsulating material. The first metal post is electrically coupled to the first plurality of redistribution lines. A first device die is encapsulated in the first encapsulating material. The first device die is bonded to the first plurality of redistribution lines through flip-chip bonding. The package further includes a second device die over and attached to the first encapsulating material through an adhesive film, a second encapsulating material encapsulating the second device die therein, a second metal post penetrating through the second encapsulating material and connected to the first metal post, and a second plurality of redistribution lines over and electrically coupled to the second device die and the second metal post.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first plurality of redistribution lines;
forming a first metal post over and electrically connected to the first plurality of redistribution lines;
bonding a first device die to the first plurality of redistribution lines through flip-chip bonding;
encapsulating the first metal post and the first device die in a first encapsulating material;
planarizing the first encapsulating material until the first metal post is exposed;
forming a second metal post over and electrically connected to the first metal post;
attaching a second device die to the first encapsulating material through an adhesive film;
encapsulating the second metal post and the second device die in a second encapsulating material;
planarizing the second encapsulating material until the second metal post and metal features on a surface of the second device die are exposed; and
forming a second plurality of redistributions over and electrically coupling to the second metal post and the second device die.

2. The method of claim 1, wherein the first plurality of redistribution lines is formed over a first dielectric layer, and the method further comprises:
patterning the first dielectric layer to expose portions of the first plurality of redistribution lines; and
bonding a package to the portions of the first plurality of redistribution lines.

3. The method of claim 1, wherein when the second device die is attached to the first encapsulating material, a layer of the first encapsulating material remains to cover the first encapsulating material.

4. The method of claim 1, wherein when the second device die is attached to the first device die, with an adhesive film comprising a first side contacting a back surface of the first device die, and a second side contacting a back surface of the second device die.

5. The method of claim 1, wherein the second device die is attached to the first encapsulating material through an adhesive film.

6. The method of claim 1, wherein the forming the first plurality of redistribution lines comprises:
forming a second dielectric layer over a first dielectric layer;
patterning the second dielectric layer to expose the first dielectric layer; and
forming a first layer of the first plurality of redistribution lines, with the first layer comprising first portions extending into the second dielectric layer, and second portions over the second dielectric layer.

7. The method of claim 6, wherein the forming the first plurality of redistribution lines comprises:
forming a third dielectric layer over the second dielectric layer;
patterning the third dielectric layer to form openings;
forming a seed layer comprising a first portion extending into the third dielectric layer;
performing a first plating to form an second layer of the first plurality of redistribution lines, wherein the second layer is formed on the seed layer, and fills the openings in the third dielectric layer; and
performing the step of forming the first metal post through a second plating, with the first metal post plated from the seed layer.

8. The method of claim 7 further comprising etching portions of the seed layer not covered by the first metal post and the second layer of the first plurality of redistribution lines.

9. The method of claim 7, wherein a portion of the second layer of the first plurality of redistribution lines has a top surface higher than a top surface of the third dielectric layer.

10. The method of claim 1 further comprising bonding a passive device to the first plurality of redistribution lines, wherein the passive device is encapsulated in the first encapsulating material.

* * * * *